United States Patent [19]

Agou et al.

[11] Patent Number: 4,966,813

[45] Date of Patent: Oct. 30, 1990

[54] REFLECTION-PREVENTIVE PELLICLE FILM

[75] Inventors: Tokinori Agou; Hitomi Matsuzaki; Masahide Tanaka; Takamasa Tsumoto; Masaaki Kawasaki; Takami Nishikawa; Shuji Minami, all of Yamaguchi, Japan

[73] Assignee: Mitsui Petrochemical Industries, Ltd., Tokyo, Japan

[21] Appl. No.: 216,955

[22] Filed: Jul. 11, 1988

[30] Foreign Application Priority Data

Jul. 10, 1987 [JP] Japan .................................. 62-171118
Oct. 13, 1987 [JP] Japan .................................. 62-258100
Jan. 27, 1988 [JP] Japan .................................. 63-16319
Jan. 27, 1988 [JP] Japan .................................. 63-16320
Jan. 27, 1988 [JP] Japan .................................. 63-16321
Feb. 29, 1988 [JP] Japan .................................. 63-47091

[51] Int. Cl.$^5$ .......................... B32B 27/00; G02B 1/10
[52] U.S. Cl. ..................................... 428/421; 350/164; 368/317; 427/165; 427/231; 427/372.2; 427/394
[58] Field of Search ....................... 428/421, 509, 519; 368/317; 350/164

[56] References Cited

U.S. PATENT DOCUMENTS 4,759,990  7/1988  Yen ..................................... 428/421

Primary Examiner—P. C. Stuby
Attorney, Agent, or Firm—Sherman & Shalloway

[57] ABSTRACT

A reflection-preventive layer composed of a specific polyfluoro(meth)acrylate is formed on one or both of the surfaces of a transparent film of a cellulose derivative. In this reflection-preventive pellicle film, the minimum light transmission in wavelengths of 350 to 450 nm is improved and the average light transmission is improved, and the adhesion of the reflection-preventive layer to the cellulose derivative layer is excellent.

13 Claims, 10 Drawing Sheets

REFLECTION-PREVENTIVE PELLICLE FILM

BACKGROUND OF THE INVENTION (1) Field of the Invention

The present invention relates to a pellicle film having a reflection-preventive layer, which is used as a pellicle as a dust-proof cover for a photomask or reticule, and a process for the preparation thereof. More particularly, the present invention relates to a pellicle film having a reflection-preventive layer of a specific polyfluoro(meth)acrylate formed on one or both of the surfaces of a transparent film of a cellulose derivative, and a process for the preparation thereof.

(2) Description of the Prior Art

There has been proposed a method in which a dust-proof cover called "pellicle" is used in combination with a photomask or reticule at the step on the light-exposing a semiconductor to prevent influences of dust on the light-exposing step and improve the productivity (see Japanese Patent Publication No. 54-28716). The pellicle has a structure comprising a pellicle film set on one side face of a pellicle frame, and the pellicle is used in the state overlapped on a photomask or reticule.

A single-layer film of nitrocellulose has been mainly used as the pellicle film of this pellicle, and for improving the throughput at the light-exposing step, there have been proposed pellicle films having a reflection-preventive layer formed on a transparent film of nitrocellulose (see Japanese Patent Application Laid-Open Specification No. 60-237450, No. 61-53601 or No. 61-209449).

More specifically, Japanese Patent Application Laid-Open Specification No. 60-237450 teaches that a fluorine type polymer or silicon type polymer is used for the reflection-preventive layer, and as the fluorine type polymer, there are disclosed a tetrafluoroethylene/vinylidene fluoride copolymer and a tetrafluoroethylene/vinylidene fluoride/hexafluoropropylene copolymer. Furthermore, Japanese Patent Application Laid-Open Specification No. 61-53601 teaches that a fluorine type polymer or a silicon type polymer is used for the reflection-preventive layer, and a tetrafluoroethylene/vinylidene fluoride/hexafluoropropylene copolymer is specifically disclosed as the fluorine type polymer. Japanese Patent Application Laid-Open Specification No. 61-209449 teaches that a fluorine type polymer including a polyfluoro(meth)acrylate can be used for the reflection-preventive layer, and a tetrafluoroethylene/vinylidene fluoride/hexafluoropropylene copolymer is specifically disclosed as in the foregoing references.

These conventional pellicle films having a reflection-preventive layer are prepared according to the process in which solutions for the transparent film and the reflection-preventive layer are supplied onto a substrate and the rotational film-forming method is adopted. This process, however, is defective in that the light transmission is low and the bonding force between the transparent film and the reflection-preventive layer is weak. Accordingly, when the pellicle film formed on the substrate is peeled from the substrate, it is necessary to swell the pellicle film in water, and there is a risk of formation of wrinkles when the peeled pellicle film is dried. Moreover, the productivity is low.

SUMMARY OF THE INVENTION

It is a primary object of the present invention to provide a pellicle film having a high light transmission, in which generation of interference light is prevented by preventing reflection of light, without performing peeling by swelling in water while preventing formation of wrinkles.

More specifically, in accordance with the present invention, there is provided a pellicle film comprising a transparent film of a cellulose derivative and a reflection-preventive layer of a specific polyfluoro(meth)acrylate formed on one or both of the surfaces of the transparent film, wherein said specific polyfluoro(meth)acrylate is selected from the group consisting of:

(1) a polyfluoro(meth)acrylate which comprises at least one monomer represented by the following general formula:

wherein $R^1$ stands for a hydrogen atom or a methyl group, and $R^2$ stands for a fluoroalkyl group which may contain an intermediate etheric oxygen atom, and which has a fluorine content of at least 50% by weight in the polymer, (2) a polyfluoroacrylate which is a copolymer of (A) trifluoroethyl acrylate and (B) perfluorooctylethyl acrylate having an (A)/(B) molar ratio of from 55/45 to 75/25 and a reduced specific viscosity lower than 1 dl/g, as measured in a m-xylene hexafluoride solution having a concentration of 0.1 g/dl at 30° C., (3) a polyfluoro(meth)acrylate which is a copolymer of at least one monomer represented by the following general formula:

wherein $R^1$ is as defined in the formula [I], and $R^3$ stands for a fluoroalkyl group, and at least one monomer represented by the following general formula

wherein $R^1$ is as defined in the formula [I], and Y stands for a hydrocarbon group containing an intermediate etheric oxygen atom or a hydrocarbon group containing an intermediate etheric oxygen atom, to which a fluoroalkyl group is bonded, (4) a polyfluoro(meth)acrylate which is a copolymer of at least one monomer represented by the following general formula:

wherein $R^1$ is as defined in the formula [I], and $R^4$ stands for a linear fluoroalkyl group not containing an etheric oxygen atom, and at least one monomer represented by the following formula:

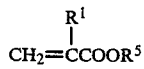
[V]

wherein $R^1$ is as defined in the formula [I], $R^5$ stands for a linear fluoroalkyl group containing an etheric oxygen atom or a branched fluoroalkyl group which may contain an etheric oxygen atom, and (5) a polyfluoro(meth)acrylate which is a copolymer of at least one monomer represented by the general formula [I] and at least one monomer represented by the following general formula:

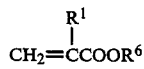
[VI]

wherein $R^1$ is as defined in the formula [I], and $R^6$ stands for an alkyl group.

Furthermore, in accordance with the present invention, there is provided a process for the preparation of a pellicle film, which comprises supplying a solution of a cellulose derivative onto a substrate to form a cellulose derivative film and supplying a solution of a polyfluoro(meth)acrylate as described above onto the cellulose derivative film to form a reflection-preventive pellicle film on one surface of the cellulose derivative film, or which comprises supplying a solution of a polyfluoro(meth)acrylate as described above onto a substrate to form a film, supplying a solution of a cellulose derivative to the formed layer to form a cellulose derivative film and supplying a solution of the polyfluoro(meth)acrylate on the top face of the cellulose derivative film to form a pellicle film having reflection-preventive films on both the surfaces of the cellulose derivative film.

DETAILED DESCRIPTION OF THE PREFERRED EMBODIMENTS

Figure 1:
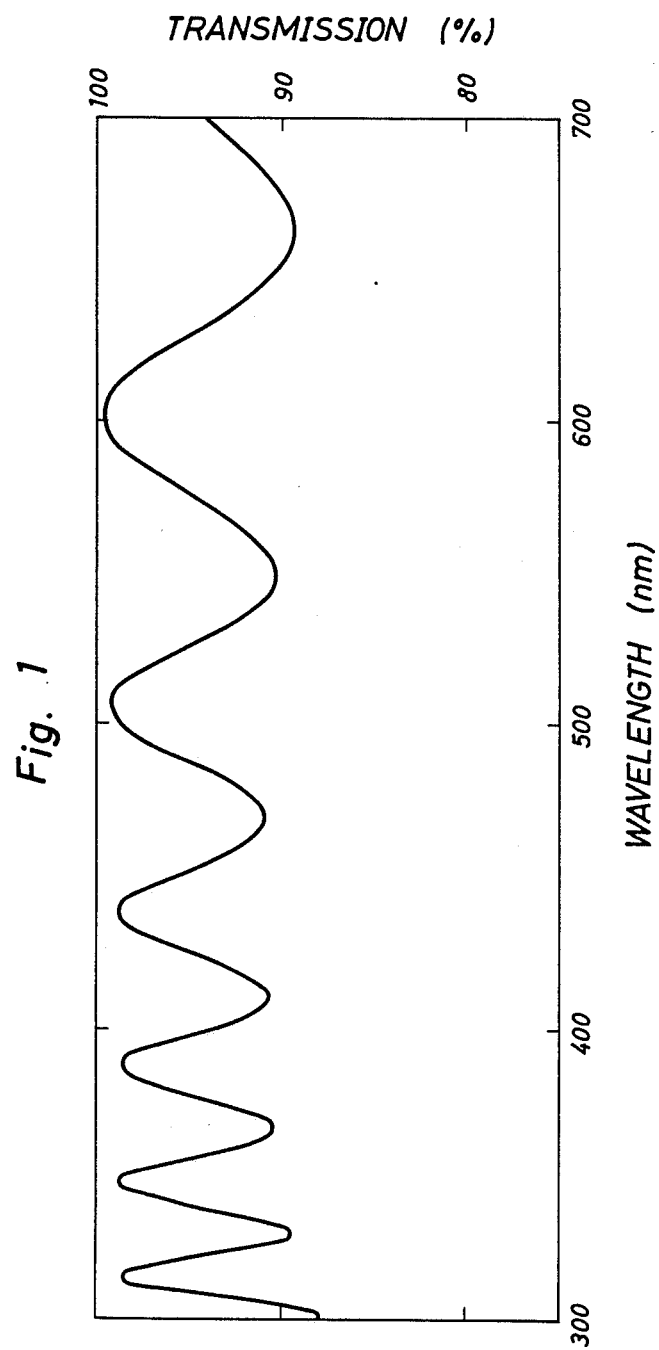
FIGS. 1 through 9 are diagrams showing light transmissions of films obtained in Example 1, Comparative Example 1, Example 2, Comparative Example 2, Comparative Example 3, Example 3, Example 5, Example 23 and Example 31, respectively.

The polyfluoro(meth)acrylate for forming a reflection-preventive layer is selected from the above-mentioned five types of compounds.

The polyfluoro(meth)acrylate (1) comprising at least one monomer represented by the following general formula:

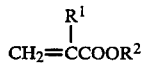
[I]

wherein $R^1$ stands for a hydrogen atom or a methyl group, and $R^2$ stands for a fluoroalkyl group which may contain an intermediate etheric oxygen atom, and having a fluorine content of at least 50% by weight in the polymer includes homopolymers and copolymers of the above-mentioned fluoroacrylate, homopolymers and copolymers of the above-mentioned fluoromethacrylate, and copolymers of the above-mentioned fluoroacrylate and fluoromethacrylate.

As $R^2$ in the formula [I], there can be mentioned —$CH_2CF_3$, —$CH_2C_2F_5$, —$CH_2C_3F_7$, —$CH_2C_4F_9$, —$CH_2C_5F_{11}$, —$CH_2C_7F_{15}$, —$CH_2C_8F_{17}$, —$CH_2C_9F_{19}$, —$CH_2C_{10}F_{21}$, —$CH_2CH_2CF_3$, —$CH_2CH_2C_2F_5$, —$CH_2CH_2C_3F_7$, —$CH_2CH_2C_4F_9$, —$CH_2CH_2C_5F_{11}$, —$CH_2$—$CH_2C_7F_{15}$, —$CH_2CH_2C_8F_{17}$, —$CH_2CH_2C_9F_{19}$, —$CH_2CH_2C_{10}F_{21}$, —$CH_2(CF_2)_2H$, —$CH_2(CF_2)_4H$, —$CH_2(CF_2)_6H$, —$CH_2(CF_2)_8H$, —$CH_2(CF_2)_{10}H$, —$CH(CF_3)_2$, —$CF(CF_3)_2$, —$(CH_2)_5OCF(CF_3)_2$, —$(CH_2)_{11}OCF(CF_3)_2$, —$CH_2O(CF_2)_2OCF_3$, —$CH_2O(CF_2)_2OC_2F_5$, —$CH_2O(CF_2)_2OC_3F_7$, —$CH_2O(CF_2)_2OC_4F_9$, —$CH_2CF_2CHFCF_2$, —$CH_2CF_2CHF(CF_2)_6H_7$, —$CH_3$—$CF(CF_2)CHFCF(CF_2)_2$, —$CH_2CF(C_2F_3)CH(CF_3)_2$, —$CH_2C_6HF_{22}$, —$C_4HF_{22}$, —$CH_2C_{10}HF_{20}$, —$CH_2$—$C_5F_3H$, —$(CH_2)_5OCF(CF_3)_2$, —$(CH_2)_{11}OCF(CF_3)_2$, —$CH_2(CF_2)_2OCF_3$, —$CH_2(CF_2)_2OC_2F_5$, —$CH_2(CF_2)_2OC_3F_7$,

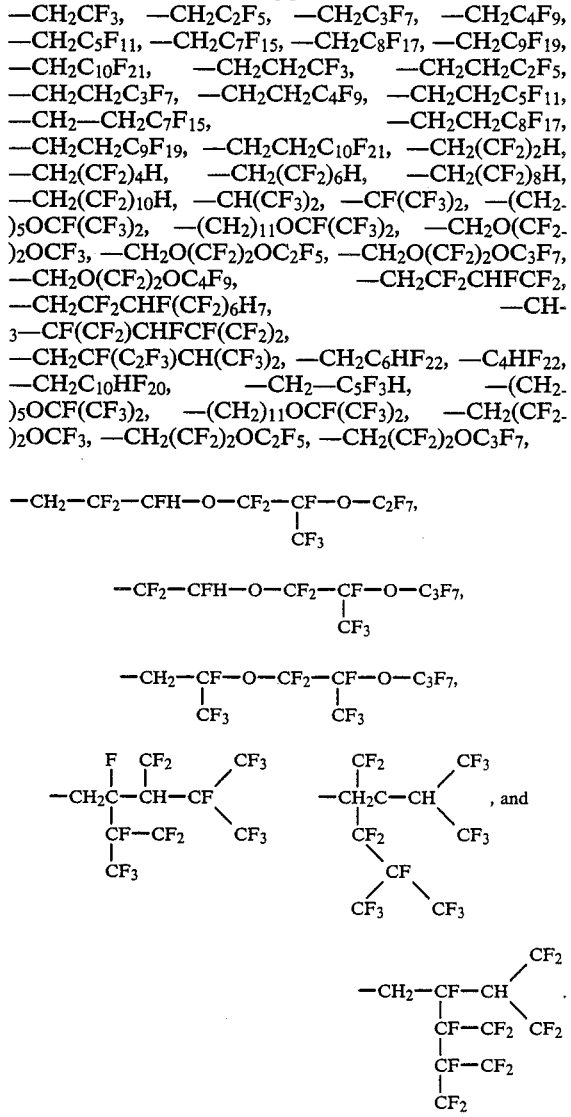

Among these polymers, polyfluoro(meth)acrylates having a fluorine content of at least 50% by weight are used. If the fluorine content of the polymer is lower than 50% by weight, the minimum light transmission in wavelengths of 350 to 450 nm is lower than 90%, and therefore, the average light transmission is reduced. Moreover, the fluctuation of change of the light transmission by interference light becomes sharp and the wavelength dependency of the transmission is too strong. The average light transmission referred to herein is a mean value of the transmission values of equal numbers of peaks and troughs of an interference wave occurring between 350 and 450 nm.

The second type of the compound used in the present invention is a polyfluoroacrylate (2) which is a copolymer of (A) trifluoroethyl acrylate ($CH_2$=$CHCOOCH_2CF_3$) and (B) perfluorooctylethyl acrylate ($CH_2$=$CHCOOC_2H_4C_8F_{17}$) having an (A)/(B) molar ratio of from 55/45 to 75/25 and a reduced specific viscosity lower than 1 dl/g, as measured in a m-xylene hexafluoride solution having a concentration of 0.1 g/dl at 30° C. If the (A)/(B) molar ratio is within the above-mentioned range, a transparent layer having a high average light transmission and a viscoelasticity is obtained. If the (A)/(B) molar ratio is higher than the higher limit of the above-mentioned range and the fluorine content is lower than 50% by weight, the layer is corroded at the time of formation of a transparent film of a cellulose derivative or the like, resulting in color unevenness, and the minimum light transmission in wavelengths of 350 to 450 nm is reduced below 90% and the average light transmission is reduced. Furthermore, the fluctuation of change of the transmission by interference light becomes sharp and the wavelength dependency of the transmission becomes strong.

The third type of the compound used in the present invention is a copolymer (3) of at least one monomer represented by the following general formula:

$$\begin{matrix} R^1 \\ | \\ CH_2=CCOOR^3 \end{matrix} \qquad [II]$$

wherein $R^1$ is as defined in the formula [I], and $R^3$ stands for a fluoroalkyl group, and at least one monomer represented by the following general formula:

$$\begin{matrix} R^1 \\ | \\ CH_2=CCOOY \end{matrix} \qquad [III]$$

wherein $R^1$ is as defined in the formula [I], and Y stands for a hydrocarbon group containing an intermediate etheric oxygen atom or a hydrocarbon group containing an intermediate etheric oxygen atom, to which a fluoroalkyl group is bonded.

An etheric oxygen-free fluoroalkyl group having 2 to 14 carbon atoms is preferred as $R^3$ in the general formula [II]. For example, there can be mentioned —$CH_2CF_3$, —$CH_2C_2F_5$, —$CH_2C_3F_7$, —$CH_2C_4F_9$, —$CH_2C_5F_{11}$, —$CH_2C_7F_{25}$, —$CH_2C_8F_{17}$, —$CH_2C_9F_{18}$, —$CH_2C_{10}F_{21}$, —$CH_2CH_2CF_3$, —$CH_2CH_2C_2F_5$, —$CH_2CH_2C_3F_7$, —$CH_2CH_2C_4F_3$, —$CH_2CH_2C_5F_{11}$, —$CH_2CH_2C_7F_{15}$, —$CH_2CH_2C_8F_{17}$, —$CH_2CH_2C_9F_{18}$, —$CH_2CH_2C_{10}F_{21}$, —$CH_2(CF_2)_2H$, —$CH_2(CF_2)_4H$, —$CH_2(CF_2)_6H$, —$CH_2(CF_2)_8H$, —$CH_2(CF_2)_{10}H$, —$CH(CF_3)_2$, —$CH_2CF_2CHFCF_3$, —$CH_2CF_2CHF(CF_2)_6H$, —$CH_2$—$CF(CF_3)CHFCF(CF_3)_2$, —$CH_2C_6HF_{12}$, —$C_6HF_{12}$, —$CH_2C_{10}HF_{20}$, —$CH_2C_5F_9H$,

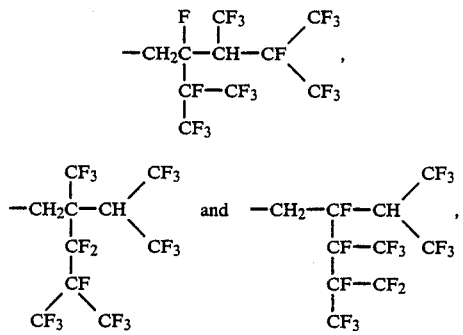

An etheric oxygen-containing hydrocarbon group having 3 to 100 carbon atoms, especially 5 to 50 carbon atoms, and an etheric oxygen-containing hydrocarbon group to which a fluoroalkyl group is bonded is preferred as Y in the general formula [III]. As Y, there can be mentioned —$CH_2CH_2OCH_3$, $+CH_2O+_2CH_3$, $+CH_2CH_2O+_3CH_3$, $+CH_2CH_2O+_4C_2H_5$, $+CH_2C$-$H_2O+_8CH_3$, $+CH_2CH_2O+_{16}CH_3$, $+CH_2C$-$H_2O+_{23}CH_3$,

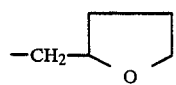

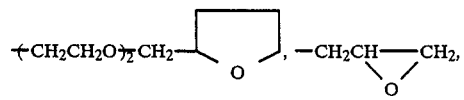

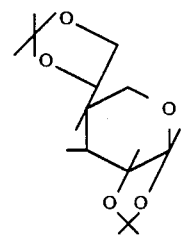

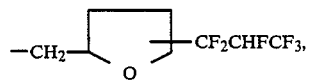

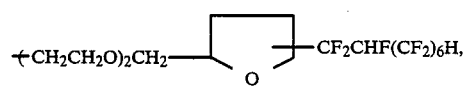

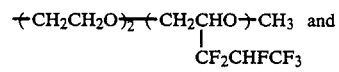 and

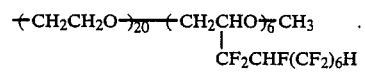

It is preferred that the mixing ratio of the etheric oxygen-containing (meth)acrylate monomer represented by the general formula III to be combined with the fluoro(meth)acrylate monomer represented by the general formula II be up to 70 mole %, especially 1 to 20 mole %. This mixing ratio is preferably selected so that the fluorine content in the copolymer is at least 50% by weight, especially 50 to 70% by weight. If this requirement is satisfied, there can be obtained a transparent layer having a high average light transmission, in which color unevenness or whitening is not caused by interlaminar disturbance. If the fluorine content in the copolymer is lower than 50% by weight, the film is corroded at the time of formation of a transparent film of a cellulose derivative or the like, resulting in color unevenness, and the minimum light transmission in wavelengths of 350 to 450 nm is reduced below 90% and the average light transmission is reduced. Furthermore, the fluctuation of change of the transmission by interference light becomes sharp and the wavelength dependency of the transmission becomes strong.

The fourth type of the compound used in the present invention is a copolymer (4) of at least one monomer represented by the following formula:

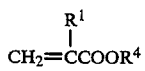 [IV]

wherein $R^1$ is as defined in the formula [I], and $R^4$ stands for a linear fluoroalkyl group not containing an etheric oxygen atom, and at least one monomer represented by the following formula:

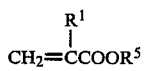 [V]

wherein $R^1$ is as defined in the formula [I], $R^5$ stands for a linear fluoroalkyl group containing an etheric oxygen atom or a branched fluoroalkyl group which may contain an etheric oxygen atom.

A linear alkyl group having 2 to 14 carbon atoms is preferred as $R^4$ in the formula [IV]. For example, there can be mentioned $-CH_2CF_3$, $-CH_2C_2F_5$, $-CH_2C_3F_7$, $-CH_2C_4F_9$, $-CH_2C_5F_{11}$, $-CH_2C_7F_{15}$, $-CH_2C_8F_{17}$, $-CH_2C_9F_{19}$, $-CH_2C_{10}F_{21}$, $-CH_2CH_2CF_3$, $-CH_2CH_2C_2F_5$, $-CH_2CH_2C_3F_7$, $-CH_2CH_2C_4F_9$, $-CH_2CH_2C_5F_{11}$, $-CH_2CH_2C_7F_{15}$, $-CH_2CH_2C_8F_{17}$, $-CH_2CH_2C_9F_{18}$, $-CH_2CH_2C_{10}F_{21}$, $-CH_2(CF_2)_2H$, $-CH_2(CF_2)_4H$, $-CH_2(CF_2)_5H$, $-CH_2(CF_2)_8H$, $-CH_2(CF_2)_{10}H$, $-CH_2CF_2CHFCF_3$ and $-CH_2CF_2CHF(CF_2)_6H$.

An etheric oxygen-containing linear fluoroalkyl group having 3 through 14 carbon atoms or a branched fluoroalkyl group which may contain an etheric oxygen atom is preferred as $R^5$ in the general formula [V]. As preferred examples of $R^5$, there can be mentioned $-CH(CF_3)_2$, $-(CH_2)_5OCF(CF_3)_2$, $-(CH_2)_{11}OCF(CF_3)_2$, $-CH_2CF(CF_3)CHFCF(CF_3)_2$, $-CH_2CF(C_2F_5)CH(CF_3)_2$, $-CF(CF_3)CHFCF(CF_3)_2$, $-CF(C_2F_5)CH(CF_3)_2$, $-CH_2CF(C_3F_7)CH(CF_3)CF(CF_3)_2$, $-CH_2C(CF_3)(C_4F_9)CH(CF_3)_2$, $-CH_2CF(C_5CF_{11})CH(CF_3)_2$, $-CH_2CF(CF_3)CH(CF_3)C(CF_3)(C_2F_5)_2$,

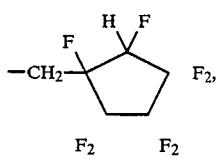

$-CH_2(CF_2)_2OCF_3$, $-CH_2(CF_2)_2OC_2F_5$, $-CH_2(CF_2)_2OC_3F_7$,

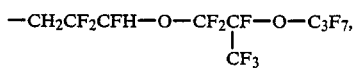

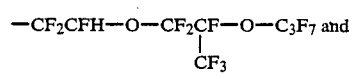 and

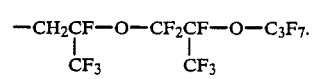

As especially preferred groups $R^5$, there can be mentioned groups represented by the following formula:

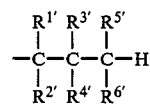

wherein $R^{1'}$ and $R^{2'}$, which may be the same or different, stand for a hydrogen atom or a methyl group, and $R^{3'}$, $R^{4'}$, $R^{5'}$ and $R^{6'}$, which may be the same or different, stand for $-F$, $-CF_3$, $-CF_2CF_3$, $-CF(CF_3)_2$, $-CF_2CF(CF_3)_2$ or $-CF(CF_3)CF(CF_3)_2$, with the proviso that the case where both of $R^{3'}$ and $R^{4'}$ stand for $-F$ and the case where both of $R^{5'}$ and $R^{6'}$ stand for $-F$ are excluded.

As specific examples, there can be mentioned

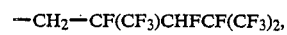

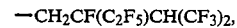

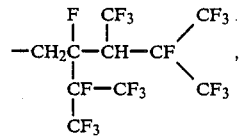

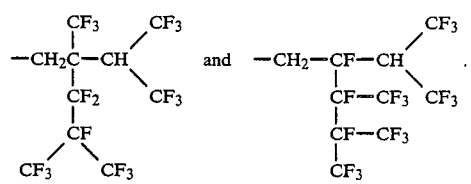

These preferred groups $R^5$ are branched fluoroalkyl groups derived from a dimer or trimer of hexafluoropropylene.

It is preferred that the mixing ratio of the alkyl group-containing (meth)acrylate monomer of the formula [V] to be combined with the fluoro(meth)acrylate of the formula [IV] be up to 70 mole %, especially 5 to 40 mole %. It is especially preferred that this mixing ratio be such that the fluorine content in the copolymer is at least 50% by weight. If this requirement is satisfied, there can be obtained a transparent layer having a high average light transmission, in which color unevenness or whitening is not caused by interlaminar disturbance.

If the fluorine content in the copolymer is lower than 50% by weight, the copolymer layer is corroded at the step of forming a transparent film of a cellulose derivative or the like, resulting in color unevenness, and the minimum light transmission in wavelengths of 350 to 450 nm is reduced below 90% and the average light transmission is reduced. Moreover, the fluctuation of change of the transmission by interference light becomes sharp and the wavelength dependency of the transmission becomes strong.

The fifth type of the polyfluoro(meth)acrylate used in the present invention is a copolymer (5) of at least one monomer represented by the general formula [I] and at least one monomer represented by the following general formula:

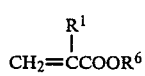 [VI]

wherein $R^1$ is as defined in the formula [I], and $R^6$ stands for an alkyl group.

As $R^6$ in the formula [VI], an alkyl group having 1 to 50 carbon atoms, especially 4 to 24 carbon atoms, is preferred. For example, there can be mentioned —$CH_3$, —$C_2H_5$, —$C_4H_9$, —$C_6H_{13}$, —$C_8H_{17}$, —$C_9H_{19}$, —$C_{10}H_{21}$, —$C_{12}H_{25}$, —$C_{17}H_{35}$, —$C_{18}H_{37}$, —$C_{24}H_{49}$ and —$C_{34}H_{69}$.

It is preferred that the mixing ratio of the alkyl group-containing (meth)acrylate monomer of the formula [VI] to be combined with the fluoro(meth)acrylate monomer of the formula [I] be up to 70 mole %, especially 5 to 40 mole %. It is particularly preferred that this mixing ratio be such that the fluorine content in the copolymer is at least 50% by weight, especially 50 to 70% by weight. If this requirement is satisfied, there can be obtained a transparent layer having a high average light transmission, in which color unevenness or whitening is not caused by interlaminar disturbance.

If the fluorine content in the copolymer is lower than 50% by weight, the copolymer layer is corroded at the step of forming a transparent film of a cellulose derivative or the like, resulting in color unevenness, and the minimum light transmission in wavelengths of 350 to 450 nm is reduced below 90% and the average light transmission is reduced. Furthermore, the fluctuation of change of the transmission by interference light becomes sharp and the wavelength dependency of the transmission becomes strong.

In the foregoing polymers and copolymers, desired fluorine contents can be obtained by appropriately adjusting the kinds of substituents, the monomer compositions and the like.

The layer of the above-mentioned polyfluoro(meth)acrylate as the reflection-preventive layer is formed on one or both of the transparent film of the cellulose derivative. It is preferred that the thickness of this reflection-preventive layer be $\frac{1}{4}n$ (n stands for the refractive index) of the wavelength of target light.

The film of the cellulose derivative is a film of nitrocellulose, ethyl cellulose, cellulose propionate or the like, and in view of the average light transmission in wavelengths of 350 to 450 nm and the film strength, cellulose propionate and nitrocellulose are preferred, and in view of the light resistance, cellulose propionate is preferred. Preferred nitrocellulose is one having a nitrification degree (N %) of 11 to 12.5%, especially 11.5 to 12.2%, and a weight average molecular weight ($\overline{Mw}$) of 150,000 to 350,000, especially 170,000 to 320,000. The thickness of the film is selected so that the transmission to a target wavelength in the range of 350 to 450 nm is increased. In order to increase the transmission to the presently adopted light-exposure wavelength of about 436 nm, about 405 nm or about 365 nm, a thickness of 2.85 μm or 0.865 μm is ordinarily selected. Cellulose propionate having a weight average molecular weight ($\overline{Mw}$) of 150,000 to 400,000, preferably 200,000 to 350,000, is ordinarily used.

The preparation of the reflection-preventive pellicle film of the present invention will now be described.

The one-surface reflection-preventive pellicle film is prepared according to the following procedures.

More specifically, a cellulose derivative solution is supplied onto a smooth substrate such as a glass sheet, and a film of a cellulose derivative is formed by the rotational film-forming method. The cellulose derivative is dissolved in a good solvent, and the solution is used, if necessary after purification such as filtration. As the solvent, there can be used ketones such as methylethylketone, methylisobutylketone and acetone, lower fatty acid esters such as butyl acetate and isobutyl acetate, and alcohols such as isopropyl alcohol. The thickness of the formed film is appropriately adjusted by controlling the viscosity of the solution, the rotation speed of the substrate and the like.

The cellulose derivative film formed on the substrate is dried by such means as hot air drying and infrared lamp irradiation to remove the residual solvent.

Then, a solution of the above-mentioned polyfluoro(meth)acrylate is supplied to the dried cellulose derivative film and a reflection-preventive layer of the fluorine-containing polymer is formed according to the same rotational film-forming method as adopted for formation of the cellulose derivative film.

A solvent capable of dissolving the polyfluoro(meth)acrylate therein but incapable of dissolving or swelling the cellulose derivative on the substrate is used for formation of the polyfluoro(meth)acrylate solution. It is preferred that the boiling point of the solvent be 40° to 220° C., especially 60° to 150° C. Aromatic halogen compounds, fluoroalkylated alcohols, fluoroolefins (for example, tetrafluoroethylene oligomer and hexafluoropropylene oligomer), and fluorinated cyclic ether compounds can be used. As specific examples of the solvent, there can be mentioned.

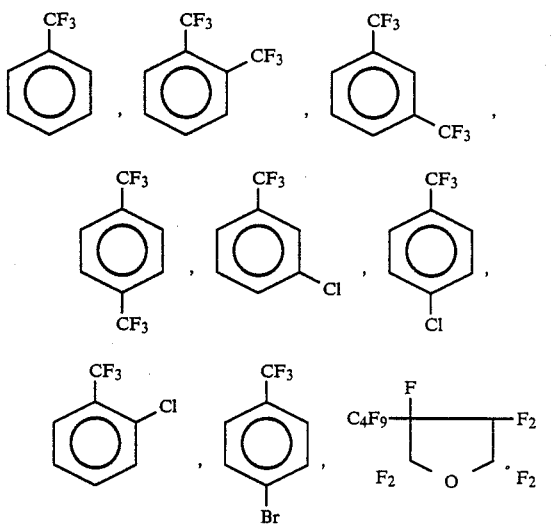

$H(CF_2)_4CH_2OH$,   $CF_3(CF_2)_2CH_2OH$,
$F(CF_2—CF_2)_2CH_2CH_2OH$, $CF_3CF_2CH_2OH$,

Among them, m-xylene hexafluoride, pentafluoropropanol and benzotrifluoride are preferred, and m-xylene hexafluoride is especially preferred.

If a solvent as described above is used, a polyfluoro(meth)acrylate solution having a good adaptability to the rotational film formation is obtained, and when the polyfluoro(meth)acrylate film is formed, dissolution or swelling of the cellulose derivative film as the base layer is not caused, and no bad influences are imposed on the cellulose derivative film. These effects are especially prominent when m-xylene hexafluoride, pentafluoropropanol or benzotrifluoride is used as the solvent.

The thickness of the reflection-preventive layer can be appropriately controlled by adjusting the viscosity of the solution, the rotation speed of the substrate and the like, as well as the thickness of the cellulose derivative film.

In case of the two-surface reflection-preventive pellicle film, a solution of a polyfluoro(meth)acrylate is supplied onto a smooth substrate such as a glass sheet, and a polyfluoro(meth)acrylate film is formed by the rotational film-forming method and dried by such means as hot air drying or infrared lamp irradiation to remove the residual solvent. Then, the above-mentioned operations are carried out in the same manner to form a two-surface reflection-preventive pellicle film having a three-layer structure of polyfluoro(meth)acrylate/cellulose derivative/polyfluoro(meth)acrylate.

The so-prepared one-surface or two-surface reflection-preventive pellicle film is peeled from the substrate and is used as a pellicle. In this case, for example, an adhesive cellophane tape or an adhesive-coated flame-like tool is applied to the outermost layer of the laminate film formed on the substrate, that is, the polyfluoro(meth)acrylate film, and one end of the cellophane tape or flame-like tool is lifted up by the hand or mechanical means. Since the interlaminar bonding force between the cellulose derivative layer and the polyfluoro(meth)acrylate layer is large, the laminate film is peeled without separation of the films and a pellicle film having a reflection-preventive layer is obtained.

In the pellicle film having a reflection-preventive layer, prepared according to the present invention, the minimum light transmission in wavelengths of 350 to 450 nm is improved and the fluctuation of change of the light transmission by interference with reflected light is reduced. Accordingly, the average light transmission is improved and the throughput at the light exposure step is increased.

In the case where the above-mentioned compound (2) is used as the polyfluoro(meth)acrylate constituting the reflection-preventive layer, a reflection-preventive film having a viscoelastic property, in which color unevenness or whitening by interlaminar disturbance is prevented, is obtained. If the compound (3), (4) or (5) is used, a lowly viscous reflection-preventive film is obtained, and this film is characterized in that dust or other foreign substance hardly adheres to the film.

The present invention will now be described in detail with reference to the following examples that by no means limit the scope of the invention.

EXAMPLE 1 AND COMPARATIVE EXAMPLE 1

Nitrocellulose was dissolved in methylisobutylketone to form a solution having a cellulose concentration of 6% by weight. Separately, a trifluoroethyl acrylate/perfluorooctylethyl acrylate copolymer (trifluoroethyl acrylate content=67 mole %, perfluorooctylethyl acrylate content=33 mole %, fluorine content=52.8% by weight) was dissolved in m-xylene hexafluoride

Figure 2:
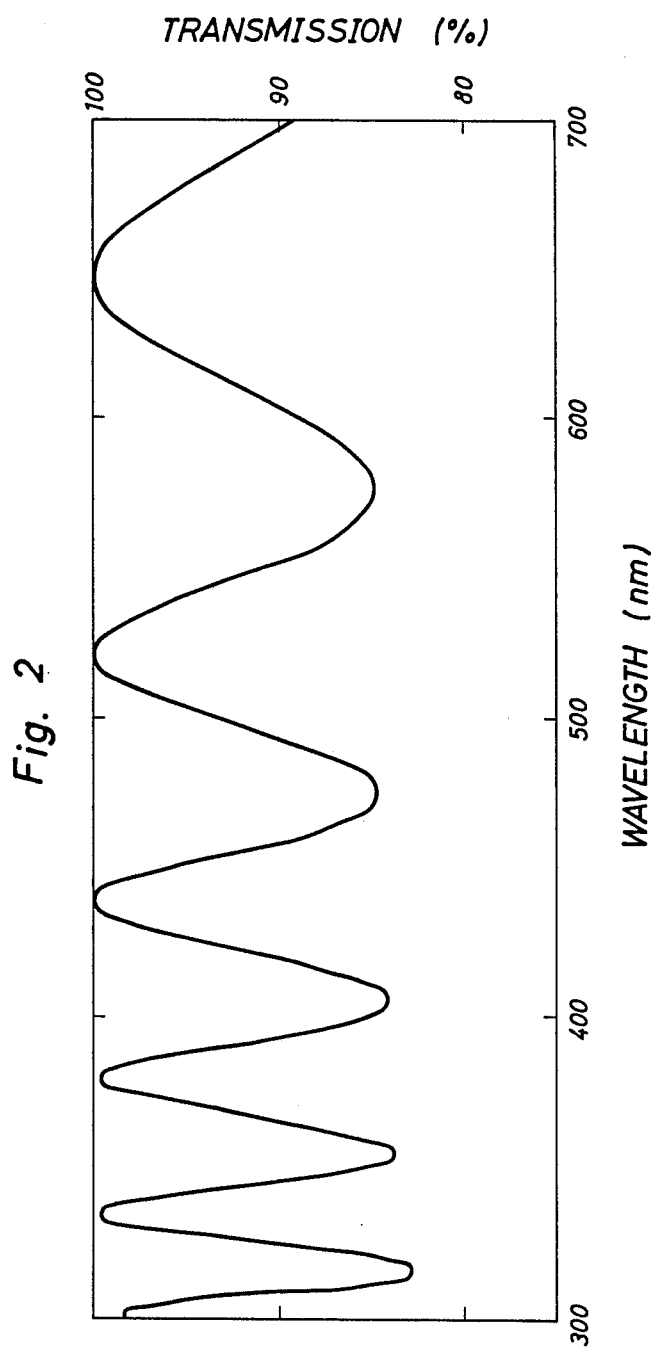

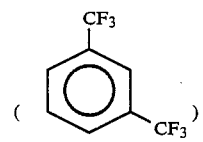

to form a solution having a copolymer concentration of 1.0% by weight. A nitrocellulose film was formed by the rotational coating method, and the nitrocellulose film was dried and the copolymer solution was dropped on the nitrocellulose film. The coated substrate was rotated at 500 rpm for 60 seconds, followed by drying. The obtained laminate film was peeled from the substrate and attached to a predetermined frame to obtain a one-surface reflection-preventive film dust-proof cover. From the results of the spectrophotometric analysis using a spectrophotometer (Model UV-240 supplied by Shimazu Seisakusho), it was found that the minimum light transmission in wavelengths of 350 to 450 nm was 90.5% and the average transmission was 94.8 to 95%, as shown in FIG. 1. The spectrophotometric characteristics of a dust-proof cover composed solely of nitrocellulose were such that the minimum light transmission was 84% and the average transmission was 92%, as shown in FIG. 2.

EXAMPLE 2

Figure 3:
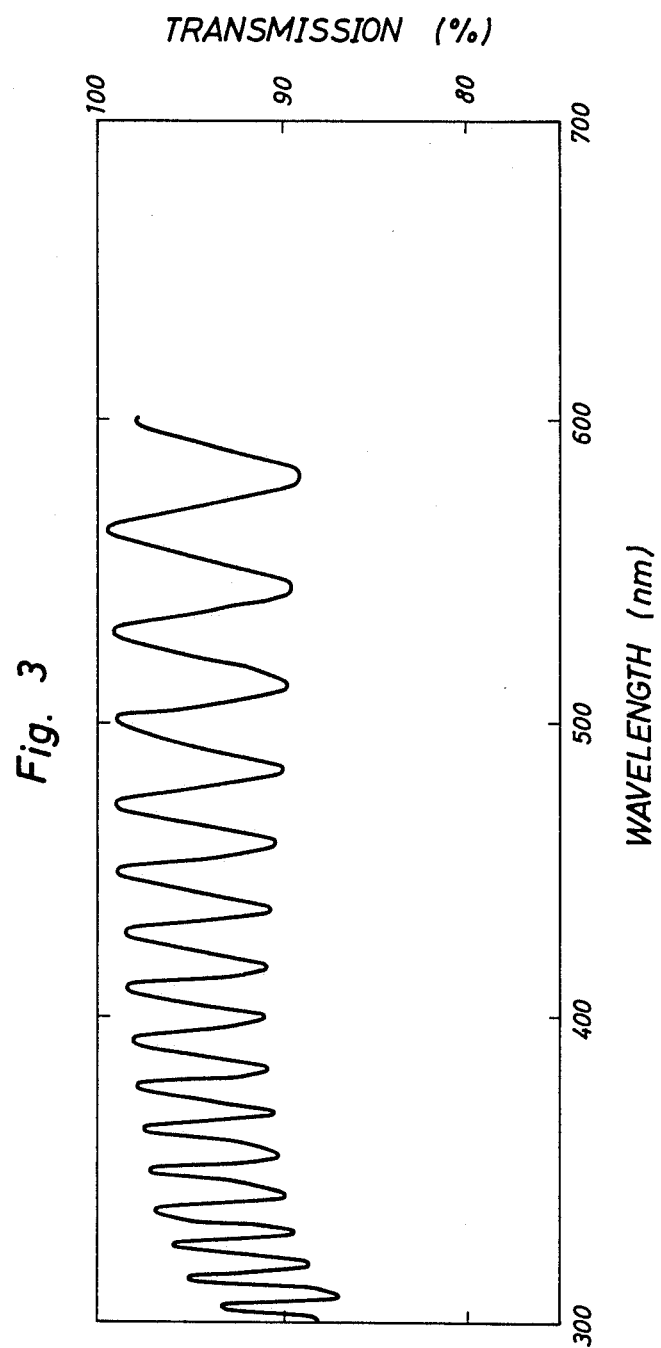

Nitrocellulose was dissolved in methylisobutylketone to form a solution having a cellulose concentration of 8% by weight. A branched fluoroalkyl group-containing polymer synthesized from a dimer of hexafluoropropylene
[$CH_2=CH-COO-CH_2CF_9CF_3)CHFCF(CF_3)_2$]
(fluorine content=59% by weight) (hereinafter referred to as "HFP-DA") was dissolved in m-xylene hexafluoride to form a solution having a polymer concentration of 1.3% by weight. A nitrocellulose film was formed on a quartz substrate by the rotational coating method and dried by a hot air drier, and the fluorine-containing polymer solution was dropped on the nitrocellulose film and the coated substrate was rotated at 600 rpm for 60 seconds, followed by drying in a hot air drier. The formed laminate film was peeled from the wafer and attached to a predetermined frame to obtain a one-surface reflection-preventive film dust-proof cover having spectrophotometric characteristics shown in FIG. 3. From the transmission spectrum, it was found that the minimum light transmission in 350 to 450 nm was 90.5% and the average transmission was 92.4%.

COMPARATIVE EXAMPLE 2

Figure 4:
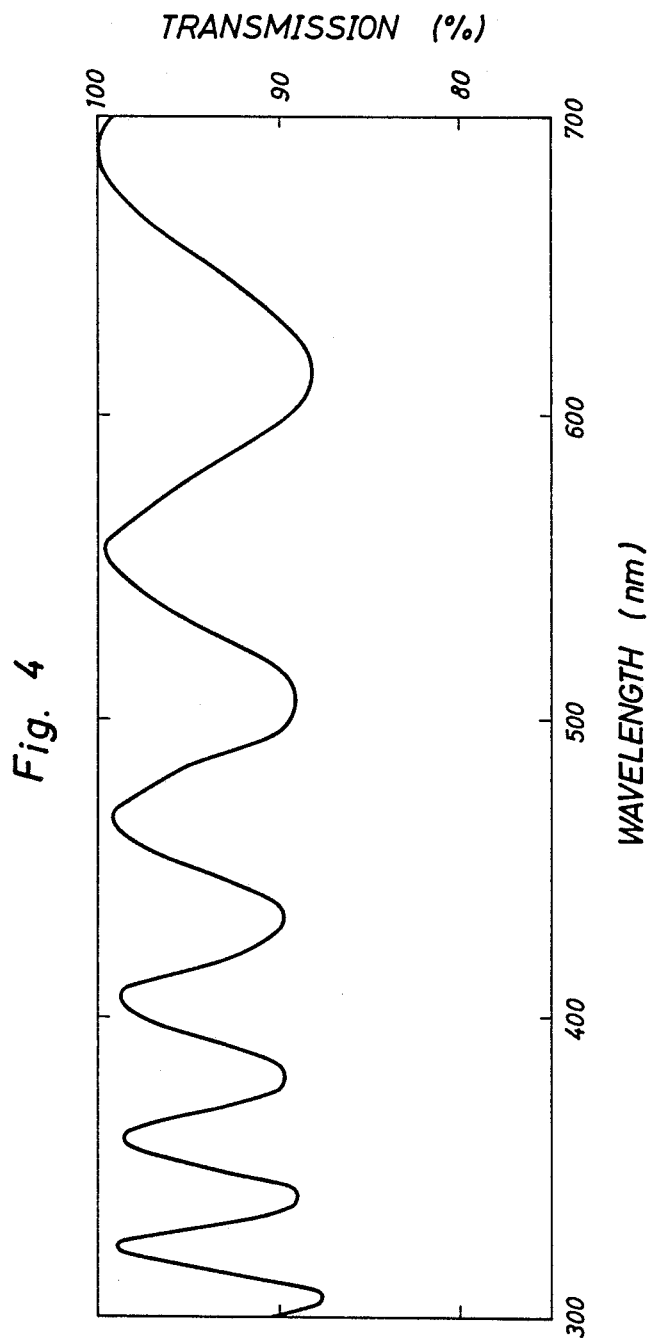

A copolymer having a fluorine content of 45% by weight was prepared in the same manner as in Example 1 except that the monomer composition was changed, and this copolymer was dissolved in m-xylene hexafluoride to form a solution having a polymer concentration of 1.0% by weight. A one-surface single-layer reflection-preventive film dust-proof cover was prepared in the same manner as described in Example 1. The results of the measurement of the spectrophotometric characteristics of the dust-proof cover are shown in FIG. 4. It was found that the minimum light transmission in 350 to 450 nm was 89.8%, which was slightly lower than 90%.

COMPARATIVE EXAMPLE 3

Figure 5:
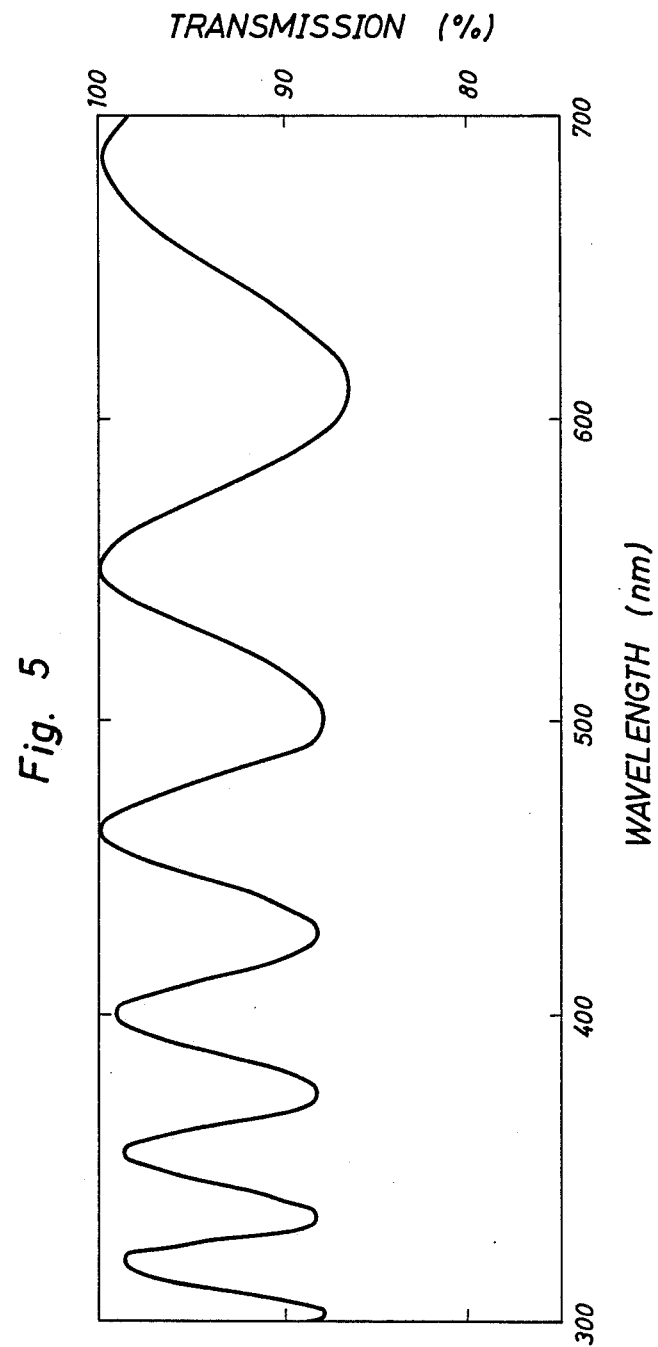

Nitrocellulose was dissolved in methylisobutylketone to form a solution having a nitrocellulose concentration of 6% by weight. Separately, a trifluoroethyl methacrylate/perfluorooctyl ethyl acrylate copolymer (trifluoroethyl methacrylate content=91 mole %, perfluorooctylethyl acrylate=9 mole %, fluorine content=40.6% by weight) was dissolved in m-xylene hexafluoride to form a solution having a polymer concentration of 0.7% by weight. A nitrocellulose film was formed on a quartz substrate by the rotational coating method and the copolymer solution was dropped on the nitrocellulose film, and the coated substrate was rotated at 500 rpm for 60 seconds, followed by drying. The film laminate was peeled from the substrate and attached to a predetermined frame to obtain a one-surface single-layer reflection-preventive film dust-proof cover. From the results of the measurement of the spectrophotometric characteristics, it was found that the minimum light transmission in 350 to 450 nm was 88%, as shown in FIG. 5.

EXAMPLE 3

Nitrocellulose was dissolved in methylisobutylketone to form a solution having a nitrocellulose concentration of 6% by weight. A trifluoroethyl acrylate/perfluorooctylethyl acrylate copolymer (trifluoroethyl acrylate content=67 mole %, perfluorooctylethyl acrylate content=33 mole %, fluorine content=52.8% by weight) was dissolved in benzotrifluoride ( 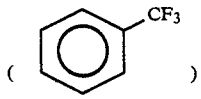 )

to form a solution having a copolymer concentration of 1.0% by weight. A quartz substrate was set at a spin coater, and the nitrocellulose solution was dropped on the substrate to form a uniform nitrocellulose film. The formed film was dried by a hot air drier.

Figure 6:
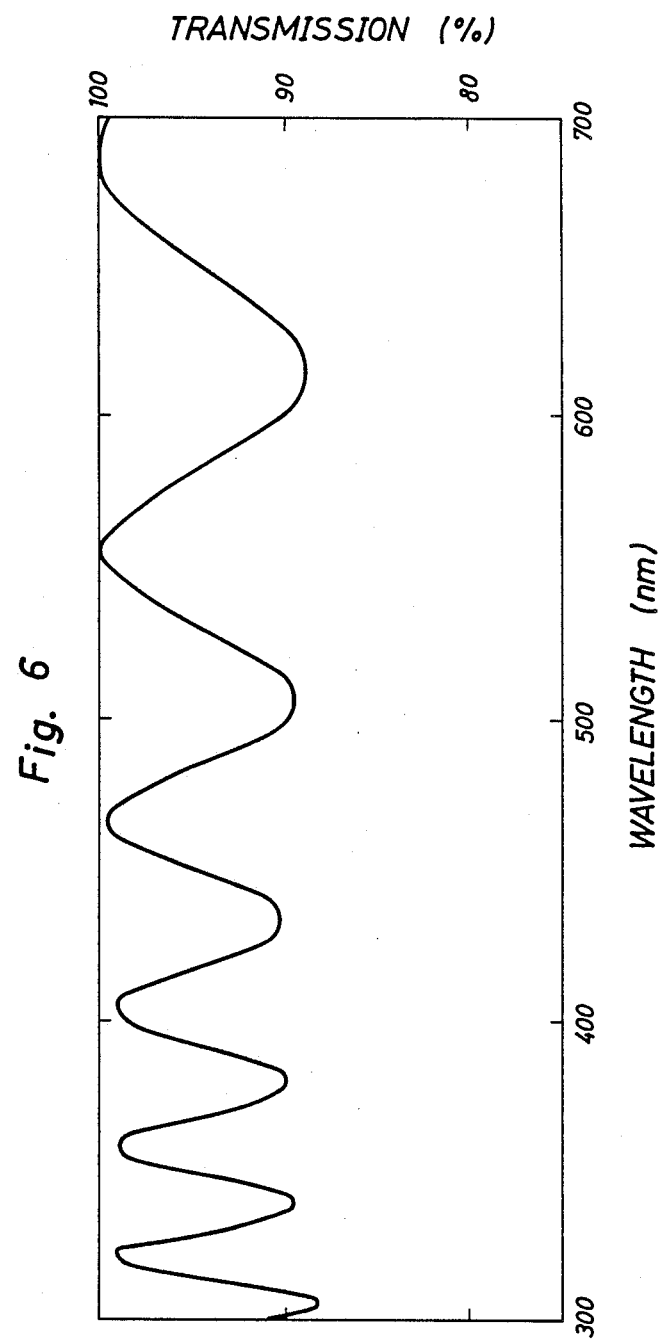

Then, the benzotrifluoride solution having a fluorine-containing polymer concentration of 1.0% by weight was dropped on the nitrocellulose film and the coated substrate was rotated at 500 rpm for 60 seconds, followed by drying by a hot air drier. The film laminate was peeled from the substrate and attached to a predetermined frame to obtain a one-surface single-layer reflection-preventive film dust-proof cover. From the results of the measurement of the spectrophotometric characteristics, it was found that in the so-obtained reflection-preventive film, the minimum light transmission in 350 to 450 nm was 90% and the average transmission was 94.2 to 94.8%, as shown in FIG. 6. The solvent used in the present example showed effects similar to those attained by the solvent for the fluorine-containing polymer used in Example 1, that is, m-xylene hexafluoride.

EXAMPLE 4

The same nitrocellulose solution and fluorine-containing polymer solution as used in Example 1 were used but the order of formation of the films was changed. Namely, a film of the fluorine-containing polymer was formed on a quartz substrate, and after drying, the nitrocellulose solution was dropped on the fluorine-containing polymer film and a one-surface single-layer reflection-preventive film was formed by the rotational coating method. The film laminate was peeled from the substrate and attached to a predetermined frame to obtain a dust-free cover. The results of the measurement of the spectrophotometric characteristics were substantially the same as the results obtained in Example 1. Namely, the minimum light transmission in 350 to 450 nm was substantially the same as that obtained in Example 1.

EXAMPLE 5

Nitrocellulose was dissolved in methyl isobutylketone to form a solution having a nitrocellulose concentration of 6% by weight. A trifluoroethyl acrylate/perfluorooctylethyl acrylate copolymer (trifluoroethyl acrylate content=67 mole % perfluorooctylethyl acrylate content=33 mole %, fluorine content=52.8% by weight) was dissolved in m-xylene fluoride to form a solution having a copolymer concentration of 1.0% by weight.

Figure 7:
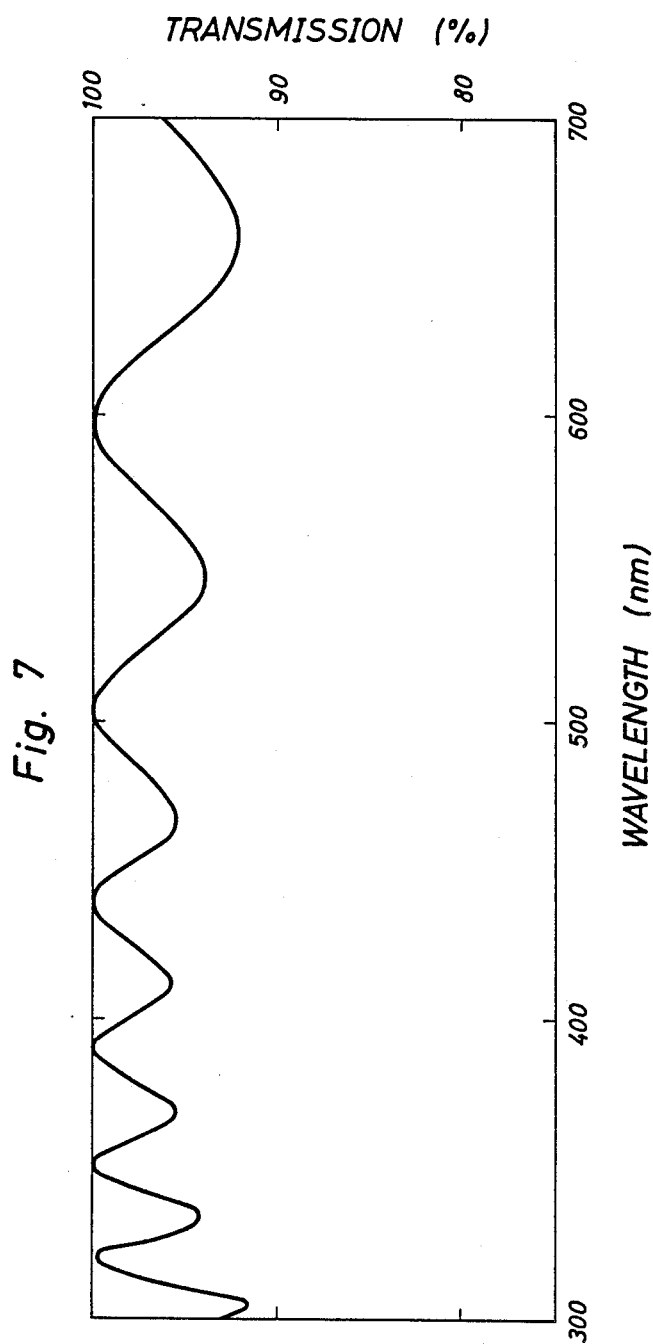

According to the rotational coating method, the fluorine-containing polymer solution was coated on a quartz substrate, and the coated substrate was rotated at 500 rpm for 60 seconds, followed by drying. The nitrocellulose solution was dropped and dried, and the fluorine-containing polymer solution was further dropped on the nitrocellulose film and the substrate was rotated at 500 rpm for 60 seconds, followed by drying. The formed two-surface single-layer reflection-preventive film could be smoothly peeled from the substrate. The results of the measurement of the spectrophotometric characteristics of the so-obtained two-surface single-layer reflection-preventive film are shown in FIG. 7. From these results, it was found that the minimum low light transmission in 350 to 450 nm was 95% and the average transmission was 97 to 98%.

EXAMPLE 6 through 13

The procedures of Example 1 were repeated in the same manner except that the fluorine-containing polymer was changed as shown in Table 1. The obtained results are shown in Table 1.

TABLE 1

| Example No. | Polyfluoro(meth)acrylate and Monomer Composition (mole %) | Fluorine Content (% by weight) | Solvent | Minimum Light Transmission (%) | Average Transmission (%) |
|---|---|---|---|---|---|
| 6 | $CH_2$=$CHCO_2CH_2CH_2C_8F_{17}$/$CH_2$=$CHCO_2CH_2CF_3$ (33/67) | 52.8 | 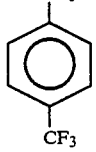 | 90.5 | 94.8~95 |

TABLE 1-continued

| Example No. | Polyfluoro(meth)acrylate and Monomer Composition (mole %) | Fluorine Content (% by weight) | Solvent | Minimum Light Transmission (%) | Average Transmission (%) |
| --- | --- | --- | --- | --- | --- |
| 7 | CH$_2$=CHCO$_2$C$_2$H$_4$C$_4$F$_9$ | 53.8 | (3,5-bis(CF$_3$)benzene) | 90.0 | 93.5~94.5 |
| 8 | CH$_2$=CHCO$_2$CH$_2$C$_3$F$_7$ | 52.4 | 4-chloro-(CF$_3$)benzene | 90.0 | 94.0 |
| 9 | CH$_2$=CHCO$_2$CH$_2$CFCHFCF(CF$_3$)$_2$ with CF$_3$ | 59.1 | CF$_3$CHFCF$_2$CH$_2$OH | 90.5 | 94.2 |
| 10 | CH$_2$=CCO$_2$C$_2$H$_4$C$_4$F$_9$ with CH$_3$ | 51.5 | H(CF$_2$CF$_2$)$_2$CH$_2$OH | 90.0 | 93.5 |
| 11 | CH$_2$=CCO$_2$CH$_2$CFCHFCF(CF$_3$)$_2$ with CH$_3$ and CF$_3$ | 57.0 | (CF$_3$)$_2$CFCHFCFCH$_2$OH with CF$_3$ | 90.5 | 94.2 |
| 12 | CH$_2$=CCO$_2$C$_2$H$_4$C$_8$F$_{17}$ with CH$_3$ | 60.7 | (CF$_3$)$_2$CFCF$_2$C=C(CF$_3$)$_2$ | 91.0 | 95~96 |
| 13 | CH$_2$=CHCO$_2$C$_2$H$_4$C$_8$F$_{17}$/CH$_2$=CHCO$_2$CH$_2$CF$_3$ (33/67) | 52.8 | C$_4$F$_9$-substituted perfluorotetrahydrofuran | 90.5 | 94.5~95 |

EXAMPLE 14

The same nitrocellulose solution and polyfluoro(meth)acrylate solution as sued in Example 1 were prepared.

According to the rotational coating method, the polyfluoro(meth)acrylate solution was dropped on a quartz substrate, and the coated substrate was rotated at 500 rpm for 60 seconds, followed by drying. Then, the nitrocellulose solution was dropped on the polyfluoro(meth)acrylate film and a nitrocellulose film was formed, followed by drying. Then, the polyfluoro(meth)acrylate solution was dropped on the nitrocellulose film and the coated substrate was rotated at 500 rpm for 60 seconds. The obtained pellicle film having reflection-preventive layers on both the surfaces could be smoothly peeled from the substrate. From the results of the measurement of the spectrophotometric characteristics of the pellicle film, it was found that the minimum light transmission in 350 to 450 nm was 95% and the average transmission was 97 to 98%.

EXAMPLE 15

A copolymer comprising 65 mole % of trifluoroethyl acrylate and 35 mole % of perfluorooctylethyl acrylate (fluorine content=53% by weight), which had a reduced specific viscosity shown in Table 2, was dissolved in m-xylene hexafluoride to form a solution having a polymer concentration of 1.0% by weight.

The solution was filtered under a pressure of 1 kg/cm$^2$ through a filter having a pore size of 0.2 μm and a diameter of 143 mm. The obtained results are shown in Table 2. It was found that if the reduced specific gravity was lower than 1 dl/g, filtration was possible, but if the reduced specific viscosity exceeded 1 dl/g, the filter was clogged and filtration became impossible.

TABLE 2

| Reduced Specific Gravity (dl/g) | Filtering Property |
| --- | --- |
| 0.91 | very good |
| 0.93 | very good |
| 0.95 | very good |
| 0.96 | very good |
| 0.97 | relatively poor but filtration possible |
| 0.99 | relatively poor but filtration possible |
| 0.02 | filtration impossible |

EXAMPLE 16

A solution of the same copolymer as used in Example 15, which had an (A)/(B) molar ratio (fluorine content) shown in Table 3 and a reduced specific viscosity lower than 1 dl/g, was dropped onto a quartz substrate, and according to the rotational coating method, the substrate was rotated at 500 rpm for 60 seconds and the coating was dried to form a polyfluoroacrylate film. Similarly, a methylisobutylketone solution containing 6% by weight of nitrocellulose was dropped on the polymer film to form a transparent film. The state of the polyfluoroacrylate film was examined. The obtained results are shown in Table 3. As is apparent from the results shown in Table 3, if the fluorine content was lower than 50% by weight, that is, the (A)/(B) molar ratio was higher than 75/25, the polyfluoroacrylate film was corroded and color unevenness was caused.

TABLE 3

| Fe Content (% by weight) | Evaluation |
|---|---|
| 44.9 | corroded |
| 49.0 | slightly corroded |
| 50.1 | not corroded |
| 53.0 | not corroded |
| 56.0 | not corroded |

Figure 10:
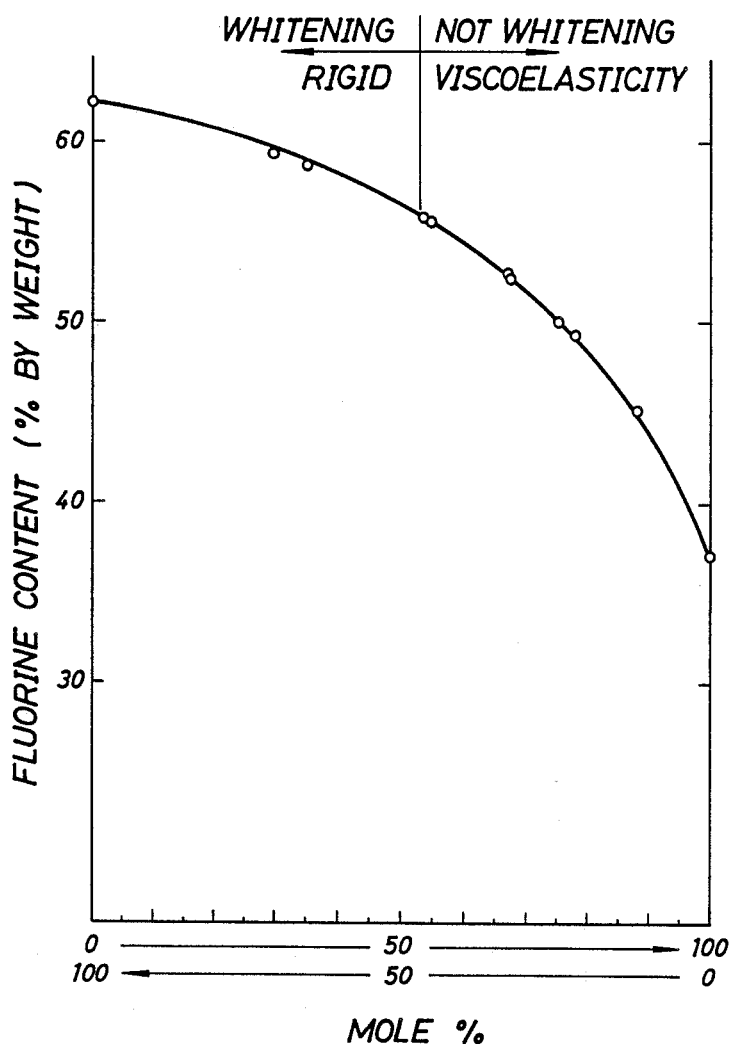
FIG. 10 is a diagram illustrating the results of the naked eye observation of the pellicle film obtained in Example 16.

When the so-obtained pellicle was observed with the naked eye, it was found that if the fluorine content exceeded 55% by weight, that is, the (A)/(B) molar ratio was lower than 55/45, whitening was caused and the pellicle film became rigid, as shown in FIG. 10.

When the (A)/(B) molar ratio was from 55/45 to 75/25 and the reduced specific viscosity was lower than 1 dl/g, the minimum light transmission of the obtained pellicle film in 350 to 450 nm was 90.5% and the average light transmission was 94.8 to 95%. In the case where the pellicle film was composed solely of nitrocellulose, the minimum light transmission was 84% and the average light transmission was 92%.

EXAMPLE 17

Nitrocellulose was dissolved in methylisobutylketone to form a solution having a nitrocellulose concentration of 6% by weight. A copolymer comprising 90 mole % of perfluorooctylethyl acrylate and 10 mole % of a compound of the following formula, separately prepared:

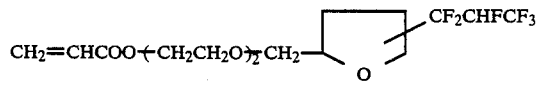

was dissolved in m-xylene hexafluoride to form a solution having a copolymer concentration of 1.0% by weight (the fluorine content was 59.8% by weight).

According to the rotational coating method, the nitrocellulose solution was dropped onto a quartz substrate to form a nitrocellulose film, and the nitrocellulose film was dried and the polyfluoro(meth)acrylate solution was dropped onto the nitrocellulose film. The coated substrate was rotated at 500 rpm for 60 seconds, followed by drying. The so-obtained pellicle film was peeled from the substrate and attached to a predetermined frame to obtain a pellicle having a reflection-preventive layer.

When the spectrophotometric characteristics of the pellicle were measured by a spectrophotometer (Model UV-240 supplied by Shimazu Seisakusho), it was found that the minimum light transmission in 350 to 450 nm was 90.5% and the average transmission was 95.2%.

The pellicle film was bonded to a fixing plate so that the nitrocellulose membrane surface confronted the fixing plate and the fluorine-containing polymer film surface was exposed to the open air, and a 7"/14 steel ball was pressed to the fluorine-containing polymer film surface under a pressing force of 31.6 g for 50 seconds. Then, the steel ball was separated from the pellicle film, and the force required for this separation was measured as the sticking force by a sensor (Yamamoto type pressing tack measuring apparatus). The measurement was conducted 10 times. The average sticking force was 3.5 g.

COMPARATIVE EXAMPLE 4

A pellicle having a one-surface single layer reflection-preventive layer was prepared in the same manner as described in Example 17 except that a copolymer comprising 67 mole % of trifluorooctylethyl acrylate and 33 mole % of perfluorooctylethyl acrylate was used as the polyfluoro(meth)acrylate. The sticking force was 14.2 g.

EXAMPLE 18

The procedures of Example 17 were repeated in the same manner except that a copolymer comprising 90 mole % of perfluorooctylethyl acrylate and 10 mole % of a compound of the following formula, separately synthesized:

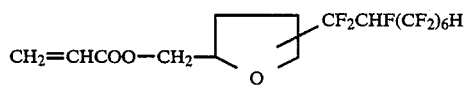

was used as the polyfluoro(meth)acrylate (the fluorine content in the copolymer was 61.4% by weight).

From the results of the spectrophotometric analysis, it was found that the minimum light transmission in 350 to 450 nm was 91.0% and the average transmission was 95.5%. The sticking force was 4.2 g.

EXAMPLE 19

The procedures of Example 17 were repeated in the same manner except that a copolymer comprising 98 mole % of perfluorooctylethyl acrylate and 2 mole % of a compound of the following formula, separately synthesized:

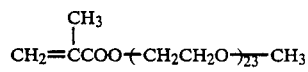

was dissolved as the polyfluoro(meth)acrylate in benzotrifluoride to form a solution having a polymer concentration of 1.0% by weight (the fluorine content in the copolymer was 59.7% by weight).

From the results of the spectrophotometry, it was found that the minimum light transmission in 350 to 450 nm was 90.5% and the average transmission was 94.8%. The sticking force was 3.8 g.

EXAMPLE 20

The procedures of Example 17 were repeated in the same manner except that a copolymer comprising 90 mole % of perfluorooctylethyl methacrylate and 10 mole % of a separately synthesized compound of the following formula:

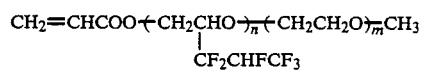

(in which n is 1, m is 2, and units m and n are randomly connected) was dissolved as the polyfluoro(meth)acrylate in heptafluoropropanol to form a solution having a polymer concentration of 0.8% by weight (the fluorine content in the copolymer was 58.6% by weight). From the results of the spectrophotometry, it was found that the minimum light transmission in 350 to 450 nm was 92.0% and the average transmission was 95.4%. The sticking force was 3.5 g.

EXAMPLE 21

The procedures of Example 17 were repeated in the same manner except that a copolymer comprising 95 mole % of perfluorooctylethyl acrylate and 5 mole % of a separately synthesized compound of the formula:

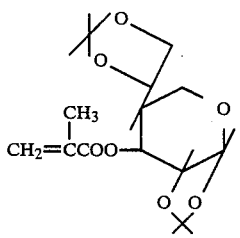

(the fluorine content in the copolymer was 60.3% by weight) was used as the polyfluoro(meth)acrylate.

From the results of the spectrophotometry, it was that the minimum light transmission in 350 to 450 nm was 92.0% and the average transmission was 95.0%. The sticking force was 4.0 g.

EXAMPLE 22

The same nitrocellulose solution and polyfluoro(meth)acrylate solution as used in Example 17 were prepared.

According to the rotational coating method, the polyfluoro(meth)acrylate solution was dropped onto a quartz substrate, the substrate was rotated at 500 rpm for 60 seconds and dried, and the nitrocellulose solution was dropped onto the polyfluoro(meth)acrylate film, followed by drying. Finally, the polyfluoro(meth)acrylate solution was further dropped onto the nitrocellulose film and the substrate was rotated at 500 rpm for 60 seconds, followed by drying. The so-obtained pellicle film having reflection-preventive layers on both the surfaces could be smoothly peeled from the substrate. From the results of the spectrophotometric analysis of the so-obtained pellicle film, it was found that the minimum light transmission in 350 to 450 nm was 95% and the average transmission was 97 to 98%. The sticking force was 3.5 g.

EXAMPLE 23

Nitrocellulose was dissolved in methylisobutylketone to form a solution having a nitrocellulose concentration of 6% by weight. Separately, a copolymer comprising 80 mole % of perfluorooctylethyl acrylate and 20 mole % of $CH_2=CHCOOCH_2CF(CF_3)CHFCF(CF_3)_2$ (HFP-DA) having a branched fluoroalkyl group, which was synthesized from a dimer of hexafluoropropylene, was dissolved in m-xylene hexafluoride to form a solution having a polymer concentration of 1.0% by weight (the fluorine content in the copolymer was 61.8% by weight).

According to the rotational coating method, the nitrocellulose solution was dropped on a quarts substrate to form a nitrocellulose film, the film was dried, the polyfluoro(meth)acrylate solution was dropped on the nitrocellulose film, and the coated substrate was rotated at 500 rpm for 60 seconds, followed by drying. The so-obtained pellicle film was peeled from the substrate and attached to a predetermined frame to obtain a pellicle having a reflection-preventive layer layer on one surface.

Figure 8:
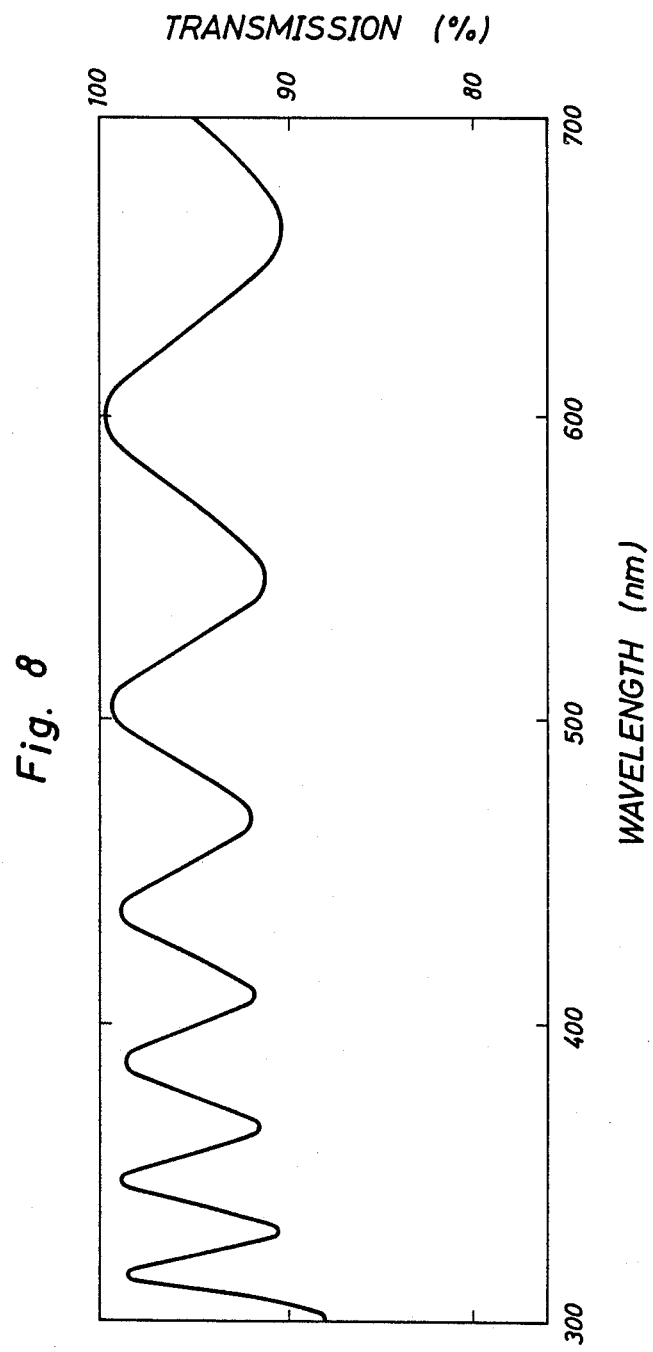

The spectrophotometric characteristics of the reflection-preventive film of the so-obtained pellicle were determined by a spectrophotometer (Model UV-240 supplied by Shimazu Seisakusho), and the obtained light transmission characteristics are shown in FIG. 8. The minimum light transmission in 350 to 450 nm and the average transmission are shown in Table 4.

The pellicle film was bonded to a fixing plate so that the nitrocellulose film surface confronted the fixing plate and the reflection-preventive layer surface confronted the open air, and a 7"/14 steel ball was pressed under a pressing force of 31.6 g for 50 seconds to the reflection-preventive layer surface. Then, the steel ball was separated from the pellicle film and the force required for this separation was measured as the sticking force by a sensor (Yamamoto type pressing tack measuring apparatus). The measurement was conducted 10 times and mean value was calculated. The obtained results are shown in Table 4.

COMPARATIVE EXAMPLE 5

A pellicle having a one-surface single-layer reflection preventive layer formed on one surface of a nitrocellulose film was prepared in the same manner as described in Example 23 except that a copolymer comprising 67 mole % of trifluoroethyl acrylate and 33 mole % of perfluorooctylethyl acrylate (the fluorine content in the copolymer was 52.8% by weight) was used instead of the polyfluoroacrylate used in Example 23. The spectrophotometric characteristics and sticking force of the pellicle were measured according to the methods described in Example 24. The obtained results are shown in Table 4.

TABLE 4

|  | Example 23 | Comparative Example 5 |
|---|---|---|
| F content (% by weight) | 61.8 | 52.2 |
| Minimum light transmission (%) | 92 | 90.5 |
| Average transmission (%) | 96 to 97 | 94.8 to 95 |
| Sticking force (g) | 4.7 | 14.2 |

EXAMPLE 24

The procedures of Example 23 were repeated in the same manner except that a copolymer comprising 90 mole % of perfluorooctylethyl acrylate and 10 mole % of HFP-DA (the fluorine content in the copolymer was 62.1% by weight) was used instead of the polymer was 62.1% by weight) was used instead of the polyfluoroacrylate used in Example 23. It was found that the minimum light transmission was 91.5% and the average transmission was 96%, and the sticking force was 4.5 g.

EXAMPLE 25

The procedures of Example 23 were repeated in the same manner except that a copolymer comprising 90 mole % of perfluorooctylethyl acrylate and 10 mole % of CH$_2$=C(CH$_3$)COOCH$_2$CF(CF$_3$)CH(CF$_3$)C(C$_2$F$_5$)$_2$CF$_3$ synthesized from tetrafluoroethylene oligomer (the fluorine content in the copolymer was 62.5% by weight) was used instead of the polyfluoroacrylate used in Example 23. It was found that the minimum light transmission was 92% and the average transmission was 96 to 97%, and the sticking force was 5.2 g.

EXAMPLE 26

The procedures of Example 23 were repeated in the same manner except that a copolymer comprising 70 mole % of perfluorooctylethyl acrylate and 30 mole % of CH$_2$=C(CH$_3$)COOCH$_2$(CF$_2$)$_2$OC$_2$F$_5$ (the fluorine content in the copolymer was 59.9% by weight) was used instead of the polyfluoroacrylate used in Example 23. It was found that the minimum light transmission was 90.5% and the average transmission was 94.5%, and the sticking force was 3.1 g.

EXAMPLE 27

Nitrocellulose was dissolved in methylisobutylketone to form a solution having a nitrocellulose concentration of 6% by weight, and a copolymer comprising 80 mole % of perfluorooctylethyl acrylate and 20 mole % of HFD-DA (the fluorine content in the copolymer was 61.8% by weight) was dissolved in m-xylene hexafluoride to form a solution having a copolymer solution of 1.0% by weight.

According to the rotational coating method, the polyfluoroacrylate solution was dropped onto a quartz substrate, the substrate was rotated at 500 rpm for 60 seconds, the formed polymer film was dried, the nitrocellulose solution was dropped on the polymer film to form a nitrocellulose film, the nitrocellulose film was dried, the polyfluoroacrylate solution was dropped on the nitrocellulose film, and the coated substrate was rotated at 500 rpm for 60 seconds, followed by drying. The formed pellicle having single-layer reflection-preventive layers on both the surfaces could be smoothly peeled from the substrate. From the results of the measurement of the spectrophotometric characteristics of the obtained pellicle, it was found that the minimum light transmission in 350 to 450 nm was 95% and the average transmission was 97 to 98%. The sticking force was 4.7 g.

EXAMPLE 28 AND COMPARATIVE EXAMPLE 6

Nitrocellulose was dissolved in methylisobutylketone to form a solution having a nitrocellulose concentration of 6% by weight. Separately, a copolymer comprising 76.5 mole % of perfluorooctylethyl acrylate, 8.5 mole % of an acrylate of the following formula having a hexfluoropropylene dimer residue:

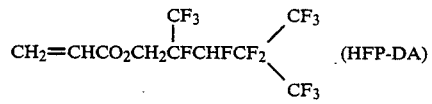

and 15 mole % of stearyl acrylate was dissolved in m-xylene fluoride to form a solution having a copolymer concentration of 1.0% by weight (the fluorine content in the copolymer was 55.8% by weight).

According to the rotational coating method, the nitrocellulose solution was dropped on a quartz substrate to form a nitrocellulose film, the film was dried, the polyfluoro(meth)acrylate solution was dropped on the nitrocellulose film, and the coated substrate was rotated at 500 rpm for 60 seconds, followed by drying. The so-obtained pellicle film was peeled from the substrate and attached to a predetermined frame to obtain a pellicle having a reflection-preventive layer on one surface.

From the results of the spectrophotometric analysis of the pellicle conducted by using a spectrophotometer (Model UV-240 supplied by Shimazu Seisakusho), it was found that the minimum light transmission in 350 to 450 nm was 90.5% and the average transmission was 94.8 to 95%.

The pellicle film was bonded to a fixing plate so that the nitrocellulose film surface confronted to the fixing plate and the reflection-preventive layer surface confronted to the open air, and a 7"/14 steel ball was pressed to the reflection-preventive layer surface under a pressing force of 31.6 g for 50 seconds. Then, the steel ball was separated and the force required for this separation was measured as the sticking force by a sensor (Yamamoto type pressing tack measuring apparatus). The measurement was conducted 10 times. The average value of the sticking force was 2.5 g.

The sticking force was similarly measured with respect to a pellicle film (Comparative Example 6) having a reflection-preventive layer of a copolymer of 80 mole % of perfluorooctylethyl acrylate and 20 mole % of HFD-DA formed on one surface of a nitrocellulose film. It was found that the sticking force was 4.7 g.

EXAMPLE 29

The same nitrocellulose solution and polyfluoroacrylate solution as used in Example 28 were prepared.

According to the rotational coating method, the polyfluoroacrylate solution was dropped on a quartz substrate, the substrate was rotated at 500 rpm for 60 seconds, the polyfluoroacrylate film was dried, the nitrocellulose solution was dropped on the polyfluoroacrylate film, the formed nitrocellulose film was dried, the polyfluoroacrylate solution was dropped on the nitrocellulose film, and the substrate was rotated at 500 rpm for 60 seconds, followed by drying. The formed pellicle film having single-layer reflection-preventive layers on both the surface could be smoothly peeled from the substrate. The pellicle film had such spectrophotometric characteristics that the minimum light transmission in 350 to 450 nm was 95% and the average transmission was 97 to 98%. The sticking force was 2.7 g.

EXAMPLE 30 AND COMPARATIVE EXAMPLE 7

A pellicle film having a reflection-preventive layer on one surface was prepared in the same manner as described in Example 28 except that a copolymer comprising 70 mole % of HEP-DA and 30 mole % of hexyl acrylate was used as the polyfluoroacrylate. The spectrophotometric characteristics of the pellicle film were such that the minimum light transmission in 350 to 450 nm was 90.5% and the average transmission was 93.0%. The sticking force was 6.1 g.

For comparison, a pellicle film having a reflection-preventive layer of a homopolymer of HFP-DA as the polyfluoroacrylate on one surface was similarly prepared. The sticking force was 9.2 g.

EXAMPLE 31

Cellulose propionate was dissolved in methylisobutylketone to form a solution having a cellulose concentration of 6% by weight. Separately, a copolymer comprising 80 mole % of perfluorooctylethyl acrylate and 20 mole % of HFP-DA (the fluorine content in the copolymer was 61.8% by weight) was dissolved in m-xylene hexafluoride to form a solution having a copolymer concentration of 1.0% by weight.

Figure 9:
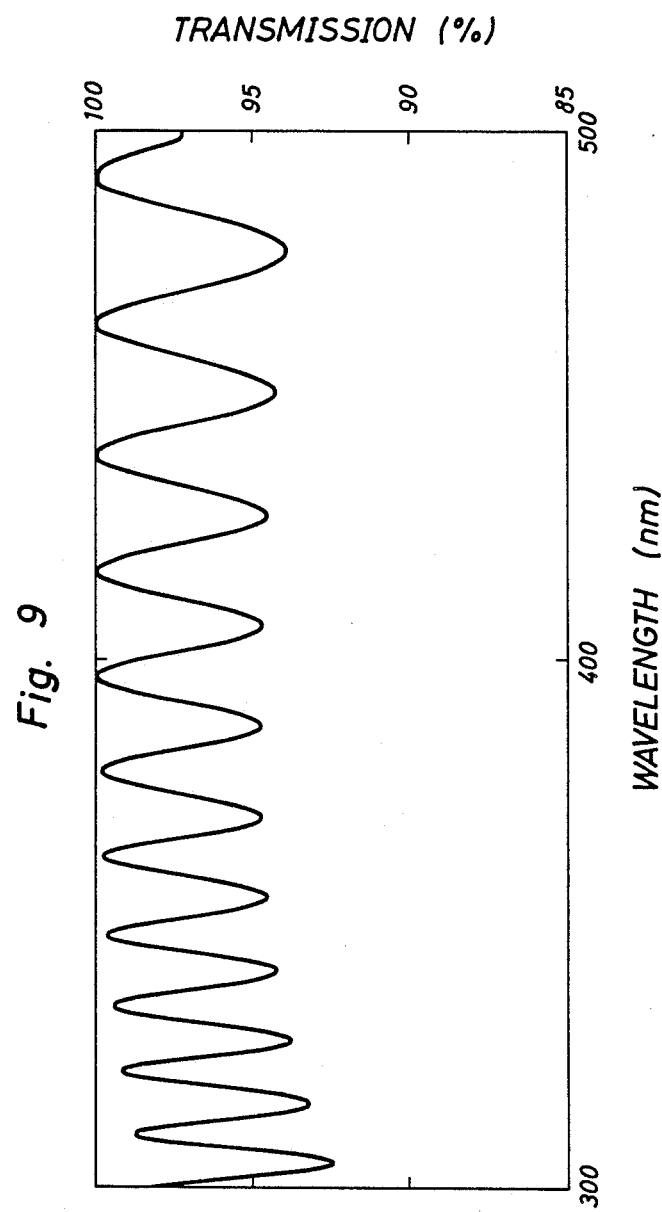

According to the rotational coating method, the polyfluoroacrylate solution was dropped onto a quartz substrate, the substrate was rotated at 500 rpm for 60 seconds, the formed film was dried, the cellulose propionate solution was dropped on the formed film, the formed cellulose film was dried, the polyfluoroacrylate solution was further dropped on the cellulose film, and the coated substrate was rotated at 500 rpm for 60 seconds, followed by drying. The formed pellicle having single-layer reflection-preventive layers on both the surfaces could be smoothly peeled from the substrate. The results of the spectrophotometric analysis of the pellicle are shown in FIG. 9. It was found that the minimum light transmission in 350 to 450 nm was 94.8% and the average transmission was 97%. The sticking force was 4.7 g.

What is claimed is:

1. A reflection-preventive pellicle film comprising a transparent film of a cellulose derivative and a reflection-preventive layer of a polyfluoro(meth)acrylate formed on one or both of the surfaces of the transparent film, wherein said polyfluoro(meth)acrylate is selected from the group consisting of:

(1) a polyfluoroacrylate which is a copolymer of (A) trifluoroethyl acrylate and (B) perfluorooctylethyl acrylate having an (A)/(B) molar ratio of from 55/45 to 75/25 and a reduced specific viscosity lower than 1 dl/g, a measured in a m-xylene hexafluoride solution having a concentration of 0.1 g/dl at 30° C., (2) a polyfluoro(meth)acrylate which is a copolymer of at least one monomer represented by the following general formula:

$$CH_2=\overset{R^1}{\underset{|}{C}}COOR^3 \qquad (II)$$

wherein $R^1$ represents a hydrogen atom or a methyl group, and $R^3$ stands for fluoroalkyl group, and at least one monomer represented by the following general formula:

$$CH_2=\overset{R^1}{\underset{|}{C}}COOY \qquad (III)$$

wherein $R^1$ is as defined above, and Y stands for a hydrocarbon group containing an intermediate etheric oxygen atom or a hydrocarbon group containing an intermediate etheric oxygen atom, to which a fluoroalkyl group is bonded, (3) a polyfluoro(meth)acrylate which is a copolymer of at least one monomer represented by the following general formula:

$$CH_2=\overset{R^1}{\underset{|}{C}}COOR^4 \qquad (IV)$$

wherein $R^1$ is as defined above, and $R^4$ stands for a linear fluoroalkyl group not containing an etheric oxygen atom, and at least one monomer represented by the following general formula:

$$CH_2=\overset{R^1}{\underset{|}{C}}COOR^5 \qquad (V)$$

wherein $R^1$ is as defined above, and $R^5$ stands for a linear fluoroalkyl group containing an etheric oxygen atom or a branched fluoroalkyl group which may contain an etheric oxygen atom, and (4) a polyfluoro(meth)acrylate which is a copolymer by the following general formula:

$$CH_2=\overset{R^1}{\underset{|}{C}}COOR^2 \qquad (I)$$

wherein $R^1$ is as defined above, and $R^2$ represents a fluoroalkyl group which may contain an intermediate etheric oxygen atom, and at least one monomer represented by the following general formula:

$$CH_2=\overset{R^1}{\underset{|}{C}}COOR^6 \qquad (VI)$$

wherein $R^1$ is as defined above, and $R^6$ stands for an alkyl group.

2. A reflection-preventive pellicle film as set forth in claim 1, wherein the cellulose derivative film is a cellulose propionate film.

3. A reflection-preventive pellicle film as set forth in claim 1, wherein the cellulose derivative film is a nitrocellulose film.

4. A reflection-preventive pellicle film comprising a transparent film of a cellulose derivative and a reflection-preventive layer of a polyfluoro(meth)acrylate formed on one or both of the surfaces of the transparent film, wherein said polyfluoro(meth)acrylate comprises a monomer represented by the following general formula:

$$CH_2=\overset{R^1}{\underset{|}{C}}COOR^2$$

wherein $R^1$ stands for hydrogen atom or methyl group, and $R^2$ stands for a perfluoroalkylether group, and has a fluorine content of at least 50% by weight in the polymer.

5. A reflection-preventive pellicle film as set forth in claim 1, wherein said perfluoroalkylether group is —$CH_2CH_2CF_3$, —$CH_2CH_2C_2F_5$, —$CH_2CH_2C_7$, —$CH_2CH_2C_4F_9$, —$CH_2CH_2C_5F_{11}$, —$CH_2CH_2C_7F_{15}$, —$CH_2CH_2C_8F_{17}$, —$CH_2CH_2C_9F_{19}$ OR —$CH_2CH_2C_8F_{20}$.

6. A reflection-preventive pellicle film as set forth in claim 4, wherein said polyfluoro(meth)acrylate comprises a monomer represented by the formula of $$CH_2=\overset{\overset{\displaystyle CH_3}{|}}{C}CO_2C_2H_4C_8F_{17}.$$

7. A reflection-preventive pellicle film comprising a transparent film of a cellulose derivative and a reflection-preventive layer of polyfluoro(meth)acrylate formed on one or both of the surfaces of the transparent film, wherein said polyfluoro(meth)acrylate is a copolymer of (A) trifluoroethyl acrylate and (B) perfluorooctylethyl acrylate having an (A)/(B) molar ratio of from 55/45 to 75/25 and a reduced specific viscosity lower than 1 dl/g, as measured in an m-xylene hexafluoride solution having a concentration of 0.1 g/dl at 30° C.

8. A reflection-preventive pellicle film comprising a transparent film of a cellulose derivative and a reflection-preventive layer of a polyfluoro(meth)acrylate formed on one or both of the surfaces of the transparent film, wherein said polyfluoro(meth)acrylate film, wherein said polyfluoro(meth)acrylate is a copolymer of (1) at least one monomer represented by the following general formula:

$$CH_2=\overset{\overset{\displaystyle R^1}{|}}{C}COOR^3$$

wherein $R^1$ stands for a hydrogen atom or a methyl group, and $R^2$ stands for a perfluoroalkyl group free of an etheric oxygen atom, having 2 to 14 carbon atoms,
and (2) at least one monomer represented by the following general formula:

$$CH_2=\overset{\overset{\displaystyle R^1}{|}}{C}COOY$$

wherein $R^1$ is as defined above, and Y stands for (i) a monovalent hydrocarbon group containing an intermediate etheric oxygen atom or (ii) a monovalent hydrocarbon group containing an intermediate etheric oxygen atom, to which a fluoroalkyl group is bonded, the group Y having 5 to 50 carbon atoms,
said copolymer having a monomer ration of the monomer (2) ranging from 1 to 20 mole % and a fluorine content of 50 to 70% by weight.

9. A reflection-preventive pellicle film as set forth in claim 7, wherein the monomer (1) is perfluorooctylethyl acrylate.

10. A reflection-preventive pellicle film as set forth in claim 7, wherein the group Y is selected from the group consisting of —CH₂CH₂OCH₃, ⁺CH₂O⁺₂CH₃, ⁺CH₂CH₂O⁺₃CH₃, ⁺CH₂CH₂O⁺₄C₂H₅, ⁺CH₂CH₂O⁺₈CH₃, ⁺CH₂CH₂O⁺₁₆CH₃, ⁺CH₂CH₂O⁺₂₃CH₃,

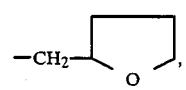

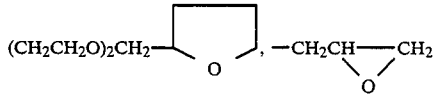

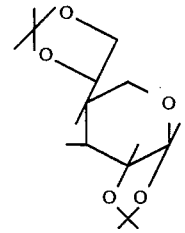

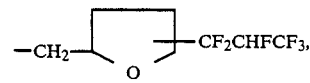

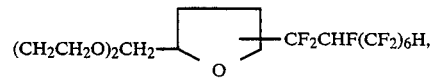

⁺CH₂CH₂O⁺₂⁺CH₂CHO⁺CH₃ and
               |
               CF₂CHFCF₃

⁺CH₂CH₂O⁺₂₀⁺CH₂CHO⁺₆CH₃
               |
               CF₂CHF(CF₂)₆H

11. A reflection-preventive pellicle film comprising a transparent film of a cellulose derivative and a reflection-preventive layer of a polyfluoro(meth)acrylate formed on or both of the surfaces of the transparent film, wherein said polyfluoro(meth)acrylate is a copolymer of (1) at least one monomer represented by the following general formula:

$$CH_2=\overset{\overset{\displaystyle R^1}{|}}{C}-COOR^4$$

wherein $R^1$ stands for a hydrogen atom or a methyl group, and $R^4$ stands for a linear fluoroalkyl group not containing an etheric oxygen atom and having 2 to 14 carbon atoms,
and (2) at least one monomer represented by the following general formula:

$$CH_2=\overset{\overset{\displaystyle R^1}{|}}{C}-COOR^5$$

wherein $R^1$ is as defined above, and $R^5$ stands for a linear fluoroalkyl group containing an etheric oxygen atom or a branched fluoroalkyl group which may contain an etheric oxygen atom, said group $R^5$ having 3 to 14 carbon atoms,
said copolymer having a monomer ratio of the monomer (2) ranging from 5 to 40 mole % and a fluorine content of at least 50% by weight.

12. A reflection-preventive pellicle film comprising a transparent film of a cellulose derivative and a reflection-preventive layer of a polyfluoro(meth)acrylate formed on one or both of the surfaces of the transparent film, wherein said polyfluoro(meth)acrylate is a copolymer of (1) at least one monomer represented by the following general formula:

$$CH_2=\overset{R^1}{\underset{|}{C}}COOR^2$$

wherein $R^1$ stands for a hydrogen or methyl group, and $R^2$ stands for a fluoroalkyl group which may contain an intermediate etheric oxygen atom, and (2) at least one monomer represented by the following general formula:

$$CH_2=\overset{R^1}{\underset{|}{C}}COOR^6$$

wherein $R^1$ is as defined above, and $R^6$ stands for an alkyl group, said copolymer having a mixing ratio of the monomer (2) ranging from 5 to 40 mole % and fluorine content of at least 50% by weight.

13. A reflection-preventive pellicle film comprising a transparent film of a cellulose derivative and a reflection-preventive layer of a polyfluoro(meth)acrylate formed on one or both of the surfaces of the transparent film, wherein said polyfluoro(meth)acrylate comprises a monomer represented by the formula of $$CH_2CHCO_2CH_2\overset{CF_3}{\underset{|}{C}}FCHFCF(CF_3)_2 \quad \text{or}$$

$$CH_2\overset{CH_3}{\underset{|}{C}}CO_2CH_2\overset{CF_3}{\underset{|}{C}}FCHFCF(CF_3)_2.$$

* * * * *